(12) United States Patent  (10) Patent No.: US 7,268,595 B2
Ajit  (45) Date of Patent: Sep. 11, 2007

(54) SYSTEM AND METHOD FOR COMPENSATING FOR THE EFFECTS OF PROCESS, VOLTAGE, AND TEMPERATURE VARIATIONS IN A CIRCUIT

(75) Inventor: Janardhanan S. Ajit, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 51 days.

(21) Appl. No.: 11/328,175

(22) Filed: Jan. 10, 2006

(65) Prior Publication Data

US 2006/0114037 A1    Jun. 1, 2006

Related U.S. Application Data

(62) Division of application No. 10/293,259, filed on Nov. 14, 2002, now Pat. No. 6,985,014.

(60) Provisional application No. 60/361,033, filed on Mar. 1, 2002.

(51) Int. Cl.
*H03B 1/00* (2006.01)

(52) U.S. Cl. .................... 327/108; 327/112; 326/82; 326/83

(58) Field of Classification Search .............. None
See application file for complete search history.

(56) References Cited

U.S. PATENT DOCUMENTS

| 4,170,740 | A | 10/1979 | Pernyeszi |
| 4,216,388 | A | 8/1980 | Wilson |
| 4,757,214 | A | 7/1988 | Kobayashi |
| 4,772,812 | A | 9/1988 | Desmarais |

(Continued)

FOREIGN PATENT DOCUMENTS

DE    27 44 209    4/1979

OTHER PUBLICATIONS

European Search Report from European Application No. 03004687.4, 3 pages, (dated Jun. 30, 2003).

(Continued)

*Primary Examiner*—Tuan T. Lam
(74) *Attorney, Agent, or Firm*—Sterne, Kessler, Goldstein & Fox PLLC (57) ABSTRACT

A system and method for compensating for process, voltage, and temperature variations in a circuit is provided. A system includes an inverter having an input port, and an output port, and is configured to (i) receive an input signal, (ii) delay the received input signal, and (iii) provide the delayed signal to the inverter output port. The system also includes a logic device including at least two input ports and an output port. A first of the at least two input ports is configured to receive the delayed signal. Finally, the system includes a charge storing device having a first end coupled, at least indirectly, to a second of the at least two input ports and a second end coupled to a logic device common node. The charge storing device is configured to (i) receive the input signal and (ii) sense a rate of change in voltage of the received input signal, the sensed voltage being representative of a corresponding current. The logic device output port is configured to output an output signal responsive to the delayed signal and the corresponding current.

5 Claims, 9 Drawing Sheets

U.S. PATENT DOCUMENTS

| | | |
|---|---|---|
| 5,107,139 A | 4/1992 | Houston et al. |
| 5,334,888 A | 8/1994 | Bodas |
| 5,546,029 A * | 8/1996 | Koke .......................... 327/108 |
| 5,561,393 A | 10/1996 | Sakurai et al. |
| 5,736,888 A * | 4/1998 | Sharpe-Geisler ............ 327/382 |
| 5,945,850 A | 8/1999 | Segan et al. |
| 6,084,437 A | 7/2000 | Sako |
| 6,222,413 B1 | 4/2001 | Cahill |
| 6,351,138 B1 * | 2/2002 | Wong ........................... 326/30 |
| 6,353,349 B1 | 3/2002 | Kwon |
| 6,545,520 B2 | 4/2003 | Maloney et al. |
| 2003/0058005 A1 | 3/2003 | Nolan |
| 2003/0067329 A1 * | 4/2003 | Sendelweck ................ 327/112 |

OTHER PUBLICATIONS

English-language Abstract of Japanese Patent Publication No. 11017520, 1 page, European Patent Office, (date of publication—Jan. 22, 1999).

* cited by examiner

SYSTEM AND METHOD FOR COMPENSATING FOR THE EFFECTS OF PROCESS, VOLTAGE, AND TEMPERATURE VARIATIONS IN A CIRCUIT

CROSS-REFERENCE TO RELATED APPLICATIONS

The present application is a Divisional of U.S. Non-Provisional application Ser. No. 10/293,259, filed Nov. 14, 2002 now U.S Pat. No. 6,985,014, which claims the benefit of U.S. Provisional Application No. 60/361,033, filed Mar. 1, 2002, all of which is incorporated by reference herein in its entirety.

BACKGROUND OF THE INVENTION

1. Field of the Invention

The present invention relates generally to controlling electrical characteristics associated with input/output (I/O) circuits. More particularly, the present invention relates to developing I/O circuits having electrical characteristics, such as operating frequencies, that are independent of variations in fabrication process, supply-voltage, and temperature (PVT) conditions.

2. Related Art

I/O circuits are used to interface traditional integrated circuits (ICs) with electrical environments external to the IC. The I/O circuit acts as a driver for signals generated by the IC and provides these signals to a pad, which in-turn interfaces with the external electrical environment. The I/O circuit may also receive signals from the external electrical environment through the pad. A critical challenge in the design, fabrication, and operation of these I/O circuits is that their electrical characteristics may vary depending on the particular PVT conditions.

In order to create independence between the electrical characteristics of the I/O circuits and PVT conditions, it is desirable that the Slew-rate (change in pad-voltage Vpad with rise time/fall time) should be relatively constant. In other words, the transient current drive $[I=(dVpad/dt)/C_{load}=Slew\text{-}rate/C_{load}$, where $C_{load}=$load capacitance] of the I/O circuit should be independent of the PVT conditions.

Traditional approaches for ensuring that the electrical characteristics of I/O circuits remain independent of PVT conditions include complicated switching arrangements. These switching arrangements, for example, switch the number of fingers between the pre-driver and the output driver devices. These traditional approaches, however, consume unacceptable amounts of the IC's real estate and are therefore less than optimal.

What is needed, therefore, is an efficient technique to ensure that the electrical performance of I/O circuits remains substantially stable and independent from PVT variations.

SUMMARY OF THE INVENTION

Consistent with the principles of the present invention as embodied and broadly described herein, an exemplary apparatus includes an inverter having an input port, and an output port, and configured to (i) receive an input signal, (ii) delay the received input signal, and (iii) provide the delayed signal to the inverter output port. The apparatus also includes a logic device including at least two input ports and an output port. A first of the at least two input ports is configured to receive the delayed signal. Finally, the system includes a charge storing device having a first end coupled, at least indirectly, to a second of the at least two input ports and a second end coupled to a logic device common node. The charge storing device is configured to (i) receive the input signal and (ii) sense a rate of change in voltage of the received input signal, the sensed voltage being representative of a corresponding current. The logic device output port is configured to output an output signal responsive to the delayed signal and the corresponding current.

The present invention enables control of the output current drive of I/O circuits independent of the PVT conditions. This is made possible by making the gate drive and the effective width of the output driver p-channel metal oxide semiconductor (PMOS) and n-channel metal oxide semiconductor (NMOS), dependent on the rate of rise of a sense voltage. When the sense voltage rises faster than normal, the gate drive of the output driver PMOS is reduced or the number of fingers of the output driver PMOS that is conducting is reduced and when the sense voltage falls faster than normal, the gate drive of the output driver NMOS is reduced or the number of fingers of the output driver NMOS that is conducting is reduced. This keeps the pad voltage rise and fall time relatively independent of fabrication process, supply-voltage and temperature.

BRIEF DESCRIPTION OF THE DRAWINGS/FIGURES

The accompanying drawings, which are incorporated in and constitute a part of the specification, illustrate an embodiment of the invention and, together with the description, explain the purpose, advantages, and principles of the invention.

FIG. 3c is an illustration of current flow through the circuit shown in FIG. 3a;

FIG. 4a is a variation of the circuit shown in FIG. 3a; and

DETAILED DESCRIPTION OF THE INVENTION

The following detailed description of the present invention refers to the accompanying drawings that illustrate exemplary embodiments consistent with this invention. Other embodiments are possible, and modifications may be made to the embodiments within the spirit and scope of the present invention. Therefore, the following detailed description is not meant to limit the invention. Rather, the scope of the invention is defined by the appended claims.

It would be apparent to one of skill in the art that the present invention, as described below, may be implemented in many different embodiments of hardware, software, firmware, and/or the entities illustrated in the figures. Any actual software code with specialized control hardware to implement the present invention is not limiting of the present invention. Thus, the operation and behavior of the present invention will be described with the understanding that modifications and variations of the embodiments are possible, given the level of detail presented herein.

Figure 1:
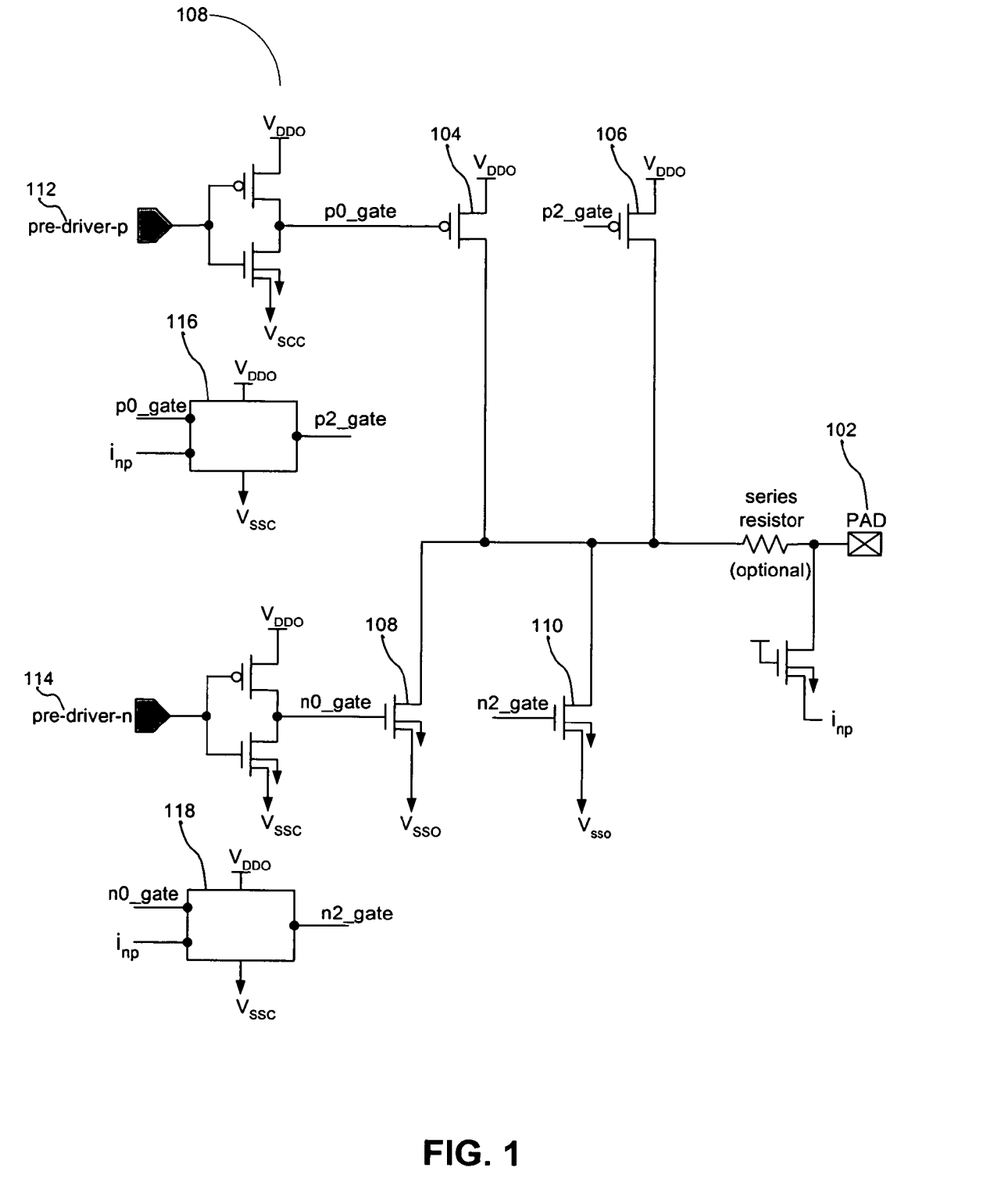
FIG. 1 is a schematic diagram of an exemplary output circuit constructed and arranged in accordance with the present invention.

An exemplary output circuit 100 is shown in FIG. 1. A pad 102 is driven by fingers of PMOS 104 and 106 and fingers of NMOS 108 and 110. A gate signal received by PMOS 104 is indicated by p0_gate and is directly generated from a pre-driver-p signal 112. A gate signal of NMOS 108 is indicated by n0_gate and is directly generated from a pre-driver-n signal 114. The gate signal for PMOS 106 is derived from PMOS PVT compensator circuit 116 and the gate signal of NMOS 110 is derived from an NMOS PVT compensator circuit 118.

When the PVT condition is such that the fall of the p0_gate signal is slow, the PMOS PVT compensator circuit 116 produces a quickly falling p2_gate signal. When the PVT condition is such that the fall of the p0_gate signal is fast, the PMOS PVT compensator circuit 116 produces a slowly falling p2_gate signal. When the PVT condition is such that the rise of the n0-gate signal is slow, the NMOS PVT compensator circuit 118 produces a quickly rising n2_gate signal. When the PVT condition is such that the rise of the n0_gate signal is fast, the NMOS PVT compensator circuit 118 produces a slowly rising n2_gate signal.

The basic idea of the compensator circuits 116 and 118 is that the rate of change of the voltage signals p0_gate/n0_gate at gates of drivers, PMOS 104 and NMOS 108, is sensed by a capacitor Cfb, within corresponding PVT compensator circuits 116 and 114. A resulting current [$I_{sense}$=Cfb*dVgate/dt] is used to adjust respective gate drive signals p2_gate/n2_gate of remaining drivers PMOS 106 and NMOS 110.

Figure 2A:
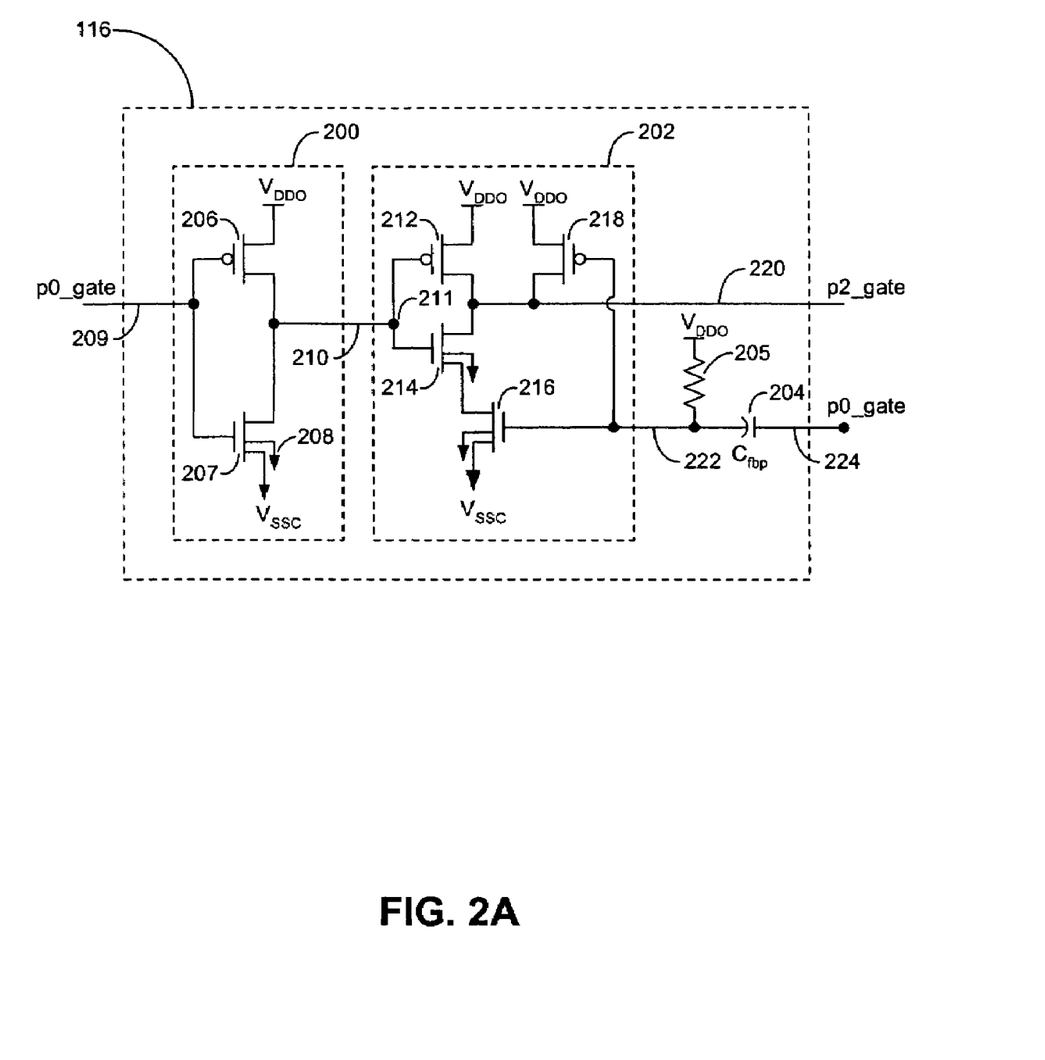
FIG. 2a is a schematic diagram of a PMOS portion of a circuit constructed and arranged in accordance with a first embodiment of the present invention.
Figure 2B:
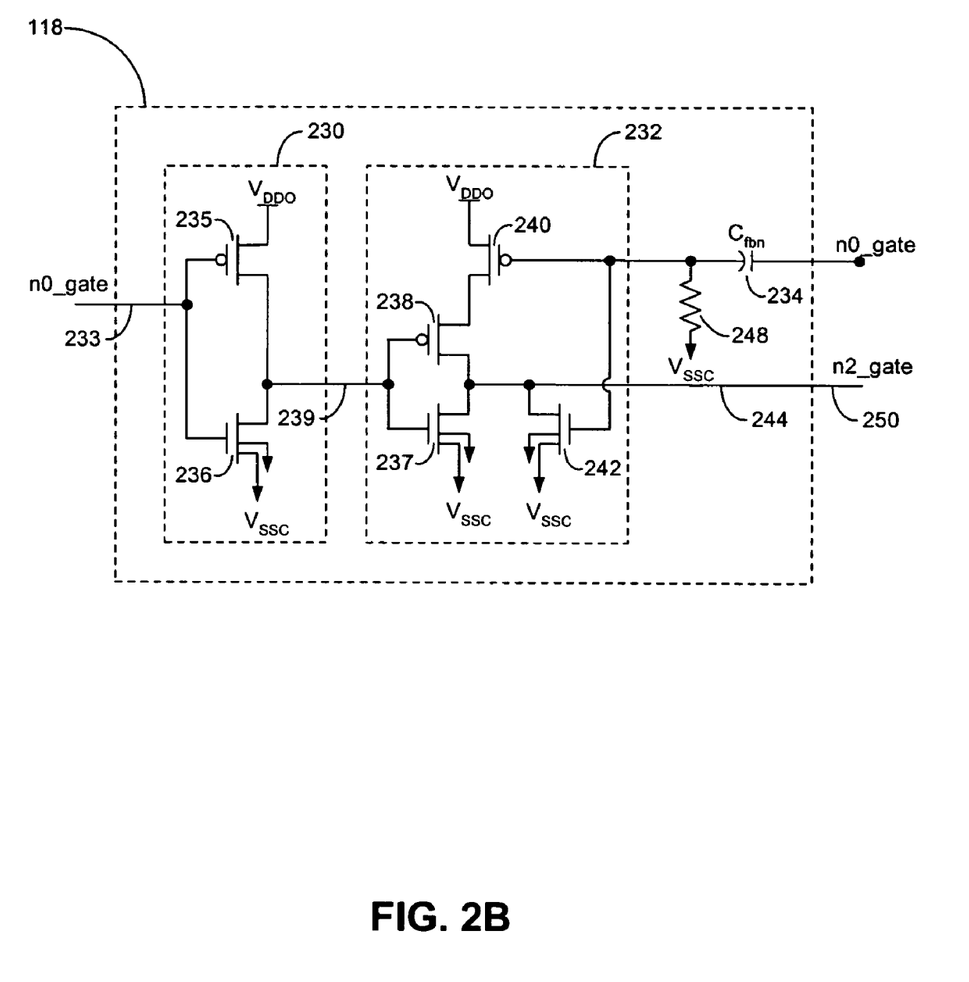
FIG. 2b is a schematic diagram of the NMOS portion of the circuit constructed and arranged in accordance with the first embodiment of the present invention.

Exemplary transistor level implementations of the compensator circuits 116 and 114 are respectively shown in FIGS. 2a and 2b. The PMOS PVT compensator circuit 116 shown in FIG. 2a includes an inverter/delay stage 200, a logic gate stage 202, and a capacitor ($C_{fbp}$) 204. In the present exemplary embodiment, the inverter/delay stage 200 is implemented using an inverter and the logic gate stage 202 is implemented using a NAND gate.

The inverter/delay stage 200 is comprised of a PMOS active device 206 and an NMOS active device 207. Although the active devices 206 and 207 are implemented using respective pull-up and pull down transistors, the present invention can be implemented using other varieties of active devices. Further, although the active device 207 is shown to have a substrate node 208, the substrate node 208 is not used in the present embodiment. Traditional power supplies provide supply voltages $V_{DD0}$ for the PMOS device 206 and $V_{SSC}$ for the NMOS device 207. As shown in FIG. 2A, gates of the active device 206 and 207 form a first input port 209 to the compensator circuit 116. The first input port 209 is configured to receive the input signal p0_gate. A connection between a source of the active device 206 and a drain of the active device 207 forms an output port of the inverter/delay stage 200.

The logic gate stage 202 is implemented in the present invention as a NAND gate including active devices 212, 214, 216, and 218. As shown, a logic gate stage 202 input port 211 is formed of gates of the active devices 212 and 214. A connection of the source of the active device 212, the drain of the active device 214, and the source of the active device 218 forms an output port 220 of the compensator circuit 116. A connection point between gates of the active devices 216 and 218 and a first end of the capacitor 204 form a node 222. An optional resistor 205 may also be connected between the node 222 and the power supply providing the voltage $V_{DD0}$. The optional resistor 205 can be used to set the steady-state bias voltage of node 222 to $V_{DD0}$. The resistors used herein can be implemented as MOSFET resistors. The other end of the capacitor 204 forms a second input port 224 to the compensator circuit 116. The second circuit input port 224 is also configured to receive the input signal p0_gate.

The voltage at the node 222 is dependent on PVT conditions and thus the gate drive signal p2_gate also depends on PVT conditions. When the voltage of the pad 102 is to be pulled high, due to the PVT conditions, the voltage p0_gate falls and becomes low. When the fall of the p0_gate signal is fast, the corresponding current [Ip=Cfbp*dV(p0_gate)/dt] through capacitor 204 is large. This quickly reduces the voltage at the node 222 and therefore one of the inputs 211 and 222 to the logic gate stage 202 becomes low. This makes the output drive voltage p2_gate of the NAND gate within the logic gate stage 202 high.

On the other hand, when the fall of the p0_gate signal is slow, as might also occur due to variations in PVT conditions, the current (Ip) through capacitor 204 is small. This in-turn keeps the voltage at the node 222 high and thus one of the inputs to the NAND gate becomes high. The other input 211 to the voltage of p0_gate is low. This makes the output drive voltage p2_gate produced at the output port 220 low, since both of the inputs to the NAND gate, within the logic gate stage 202, are high.

The NMOS PVT compensator circuit 118 is shown in FIG. 2b. The NMOS PVT compensator circuit 118 cooperatively functions with the compensator circuit 116 to ameliorate the effects of PVT variations in I/O circuits, such as the I/O circuit 100 shown in FIG. 1.

The compensator circuit 118 includes an inverter/delay stage 230, a logic gate stage 232, and a capacitor (Cfbn) 234. The capacitors of the present invention can be implemented in many ways including MOS capacitors, Metal-Oxide-Metal capacitors etc. In the NMOS circuit 118, the inverter/delay stage 230 is also implemented using an inverter, as in the case of the inverter/delay stage 200 above. The inverter/delay stage 230 respectively includes PMOS and NMOS active devices 235 and 236.

Gates of the active devices 235 and 236 combine to form a first input port 233 to the NMOS PVT compensator circuit 118. The first input port 233 is configured to receive the input signal n0_gate. An inverter/delay stage 230 output port is formed of a source and a drain of the active devices 235 and 236 respectively. The output port of the inverter/delay stage 230 is coupled to an input port 239 of the logic gate stage 232 of the compensator circuit 118.

The logic gate stage 232 is implemented using a NOR gate, which is in-turn formed using active devices 237, 238, 240, and 242. A connection point of the source of the active device 238, the drain of the active device 236, and the drain of the active device 242 forms an output port 244 of the compensator circuit 118 from it NOR gate that is configured to output a signal n2_gate. A connection point between gates of the active devices 240 and 242 and a first end of the capacitor 234 forms a node 246. An optional resistor 248 may also be connected between the node 246 and the power supply providing the voltage $V_{SSC}$. The other end of the capacitor 234 forms a second input port 250 to the compensator circuit 118. The second circuit input port 224 is also configured to receive the input signal n0_gate.

A voltage at the node 246 depends on PVT conditions and thus the signal n2_gate also depends on PVT conditions. When the voltage of the 102 pad is pulled low, the voltage n0_gate is correspondingly pulled high. When the rise of n0_gate signal is fast, the current [In=Cfbn*dV(n0-gate)/dt] through the capacitor 234 is large. This quickly increases the voltage at the node 246. Since the voltage at the node 246 quickly increases, the input 246 to the NOR gate becomes high. Correspondingly, the output voltage n2_gate of the NOR gate becomes low. When the rise of the n0_gate signal is slow, the current (In) through capacitor 234 is small. This keeps the voltage at the node 246 low and so the associated input to the NOR gate becomes low. The other input 239 to the NOR gate is low since it is the inverse of voltage of n0_gate and voltage of n0_gate is high. This makes the output voltage n2_gate of the NOR gate high since both the inputs are low.

Figure 3A:
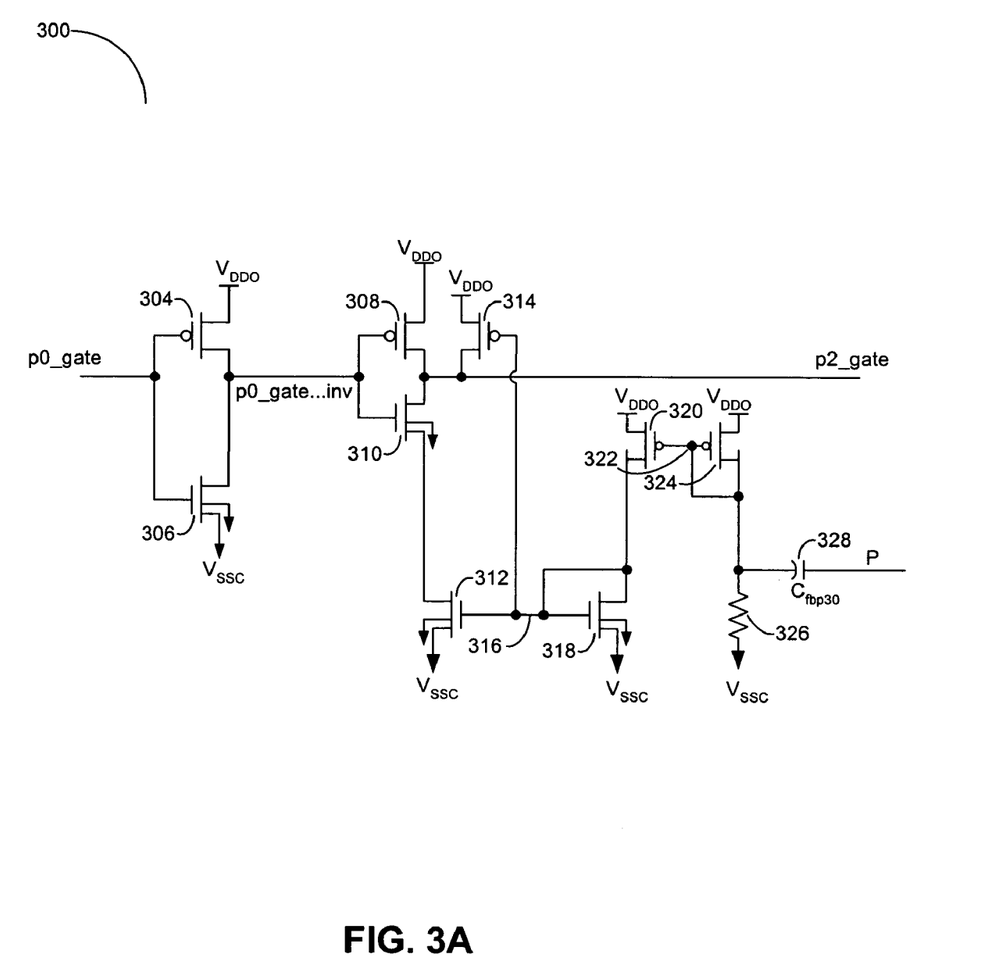
FIG. 3a is a schematic diagram of a PMOS portion of a circuit constructed and arranged in accordance with a second embodiment of the present invention.
Figure 3B:
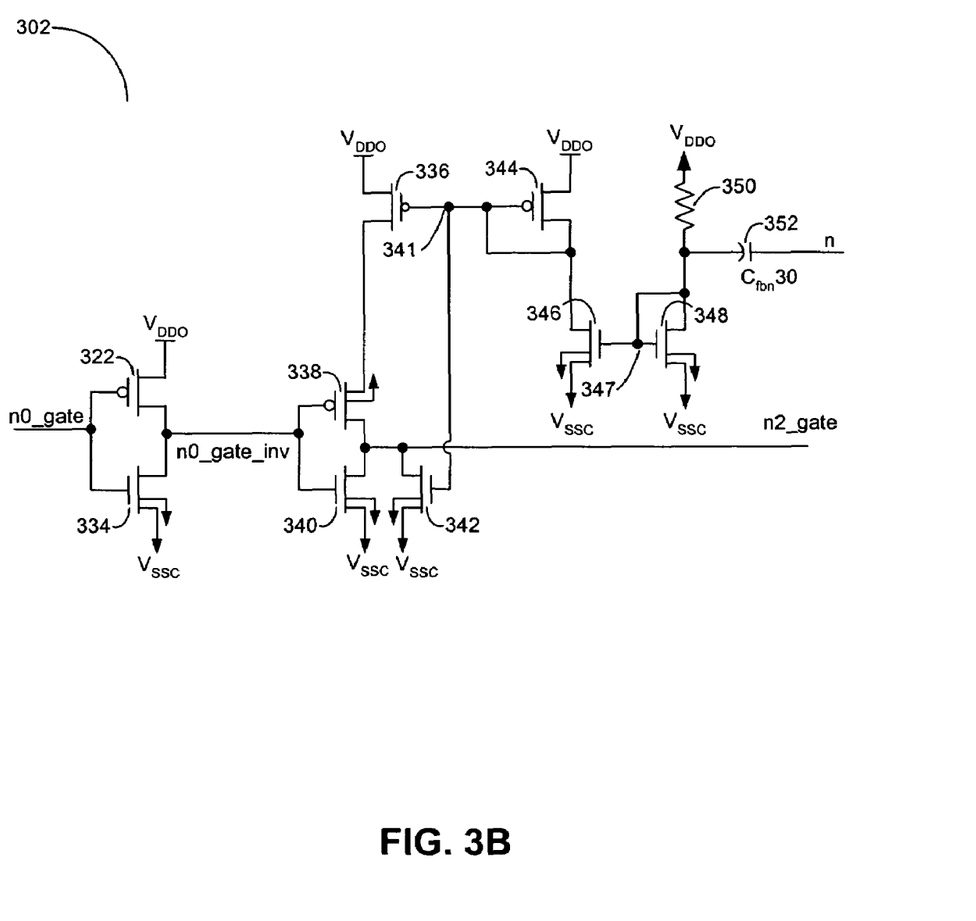
FIG. 3b is a schematic diagram of the NMOS portion of the circuit constructed and arranged in accordance with the second embodiment of the present invention.

Another exemplary transistor level implementation of the compensator circuit, including circuit portions 300 and 302, is illustrated in FIGS. 3A and 3B. This implementation requires pre-driver signals (P) and (N) inputs in addition to p0_gate and n0_gate input signal. A PMOS compensator circuit 300 is shown in FIG. 3A.

In the circuit 300 of FIG. 3A, a capacitor (Cfbp30) 328 senses the rate of change of the pre-driver voltage $V_p$ of the signal (P). When the pre-driver voltage $V_p$ quickly increases with time [high rising $dV_p/dt$], a current [I31] flows across the capacitor 328 depending on the $dV_p/dt$ and the particular value of the capacitors [I30=Cfbp30*dVp/dt]. The increase of I30 reduces the current (I32) through PMOS transistor 324. Using a current mirror with multiplication, this reduction in current (I32) is multiplied to the required level and the resulting current reduces the gate drive of NMOS 312 and simultaneously increases the gate drive of PMOS 314. This results in control of the gate-drive p2_gate applied to a sub-section (fingers) of the PMOS driver 106. The current mirror includes PMOS transistors 320 and 324.

Figure 3C:
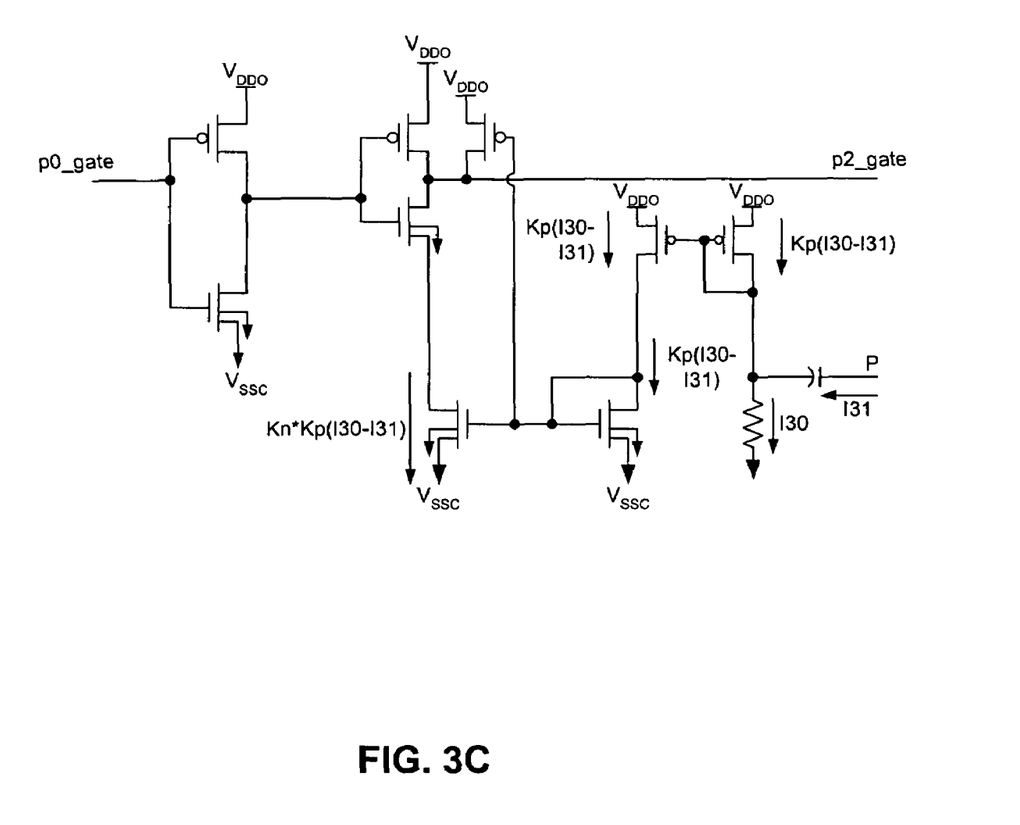

The ratio of the effective width/length (W/L) of the device 320 to 324, is Kp, also known as the current multiplication factor. When the reduction in the current (I32) occurs through the device 324, the reduction in the current (I33) through the device 320 is Kp*I32. A resistor 326 is used to set the steady-state bias voltage of node 316 to $V_{DDO}$. The current flowing through NMOS 318 is equal to the current that flows through PMOS transistor 320. The ratio of effective W/L of NMOS 312 to NMOS 318 is Kn, the current multiplication factor. When the reduction in current I33 occurs through nmos 318, the reduction in current (I34) through PMOS 314 is Kn*I33 =Kn*KP*I32. The current flow through the PMOS compensator circuit 300 is shown in FIG. 3C.

When the $dV_p/dt$ is small, the PMOS fingers 106 and 106 are enabled through their respective gate drive signals p0_gate and p2_gate. When the $dV_p/dt$ gets larger, the current through capacitor 328 increases, which in-turn increases the voltage of the node 322. Consequently, the voltage of node 316 is also lowered, resulting in the voltage of the p2_gate going higher and disabling a portion of the PMOS finger 106. Thus, the total current supplied from the PMOS fingers 104 and 106 is kept relatively constant and the rate of rise of the pad-voltage (rising Slew-rate) associated with the pad 102 is kept relatively constant. In short, when the current supplied by portion of PMOS MPd0 becomes higher, a portion of the PMOS 106 is disabled by the PVT compensation circuit 300 to keep the total current supplied by the PMOS fingers 104 and 106 constant across varying PVT conditions.

Figure 3D:
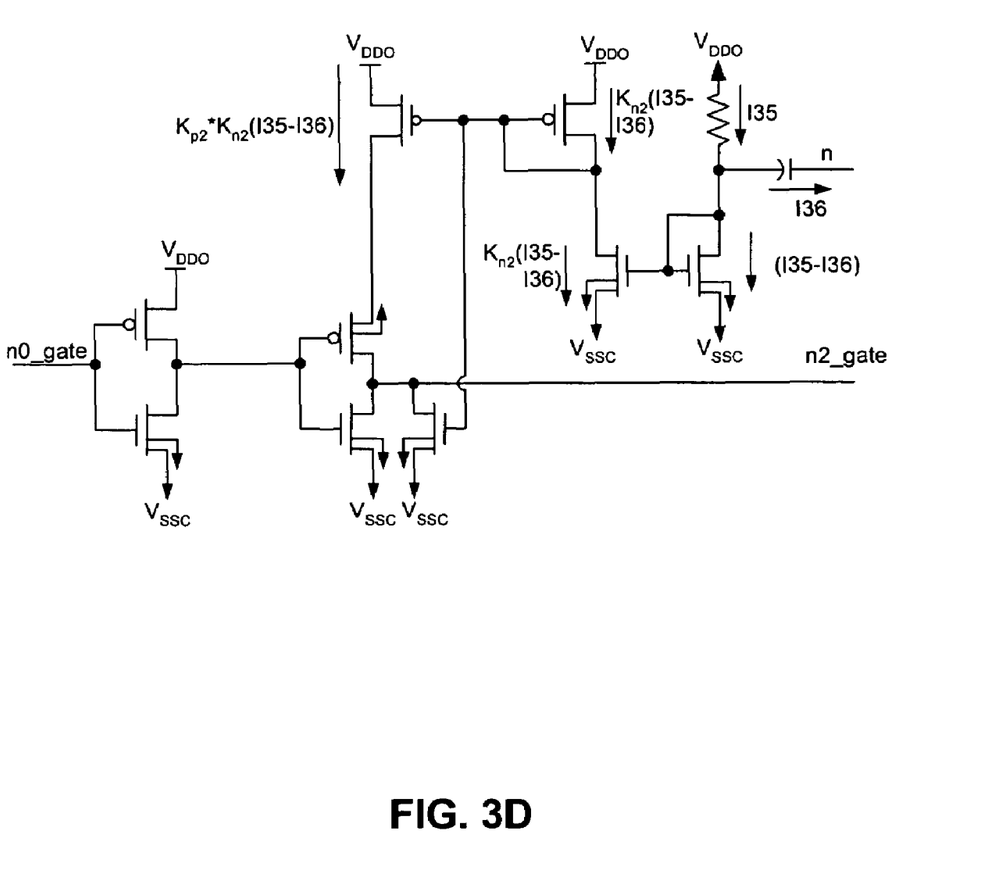
FIG. 3d is an illustration of current flow through the circuit shown in FIG. 3b.

A similar circuit 302 is used in the driver NMOS section, as shown in FIG. 3B. When a pre-driver voltage n increases slowly with time, the rising magnitude of $dV_n/dt$ is small, the node 347 remains at a high-voltage, which causes the node 341 to remain at a low-voltage. This occurrence leads to the voltage of the n2_gate going high and all of the NMOS fingers 108 and 110 are enabled through their respective gate n0_gate and n2_gate drive signals. When the $dV_n/dt$ gets larger in magnitude, a current 135 through a capacitor 352 increases which reduces a current I36 through NMOS 348. This reduces the current through NMOS 346 (Kn2*I36), which in-turn reduces the current through PMOS 344, thus increasing the voltage of node 341, resulting in the voltage of n2_gate going lower. Consequently, a portion of the NMOS finger 110 is disabled. Thus the total current supplied from the NMOS 108 and 110 is relatively constant and hence the rate of fall of the pad-voltage (falling Slew-rate) is kept relatively constant. A current flow through the NMOS compensator circuit 302 is shown in FIG. 3D.

Figure 4A:
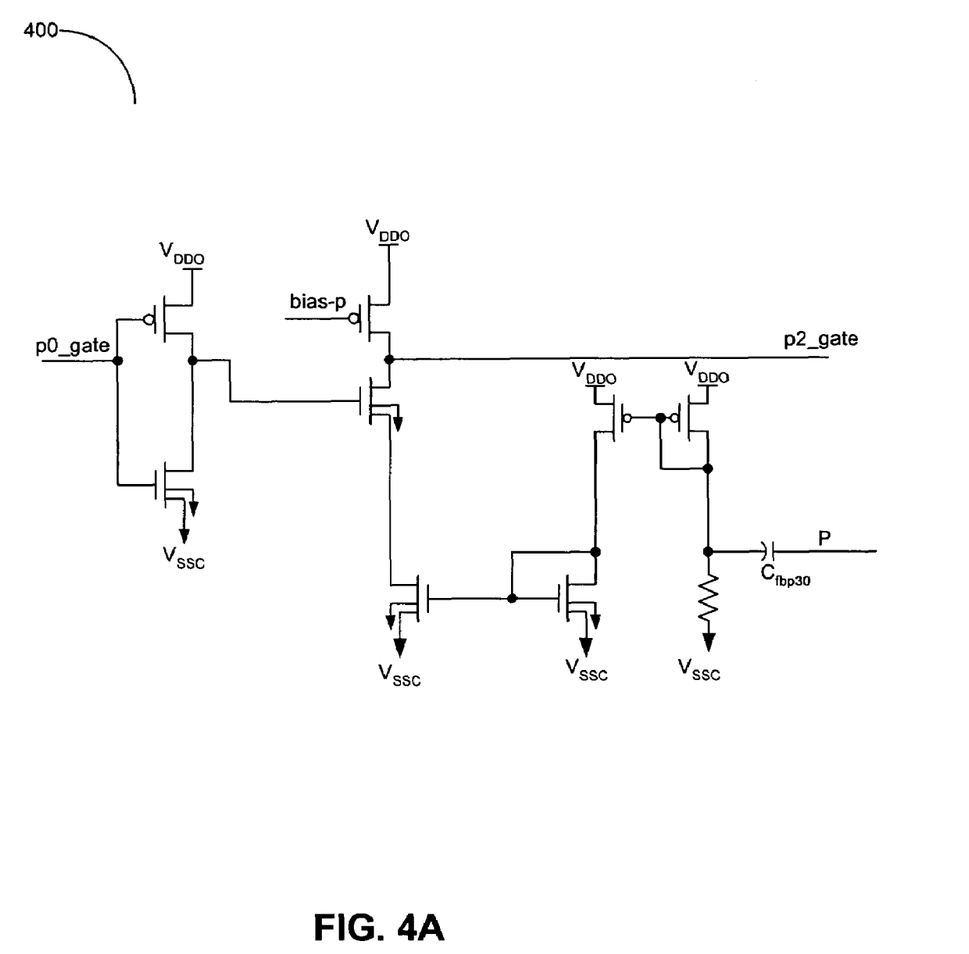
Figure 4B:
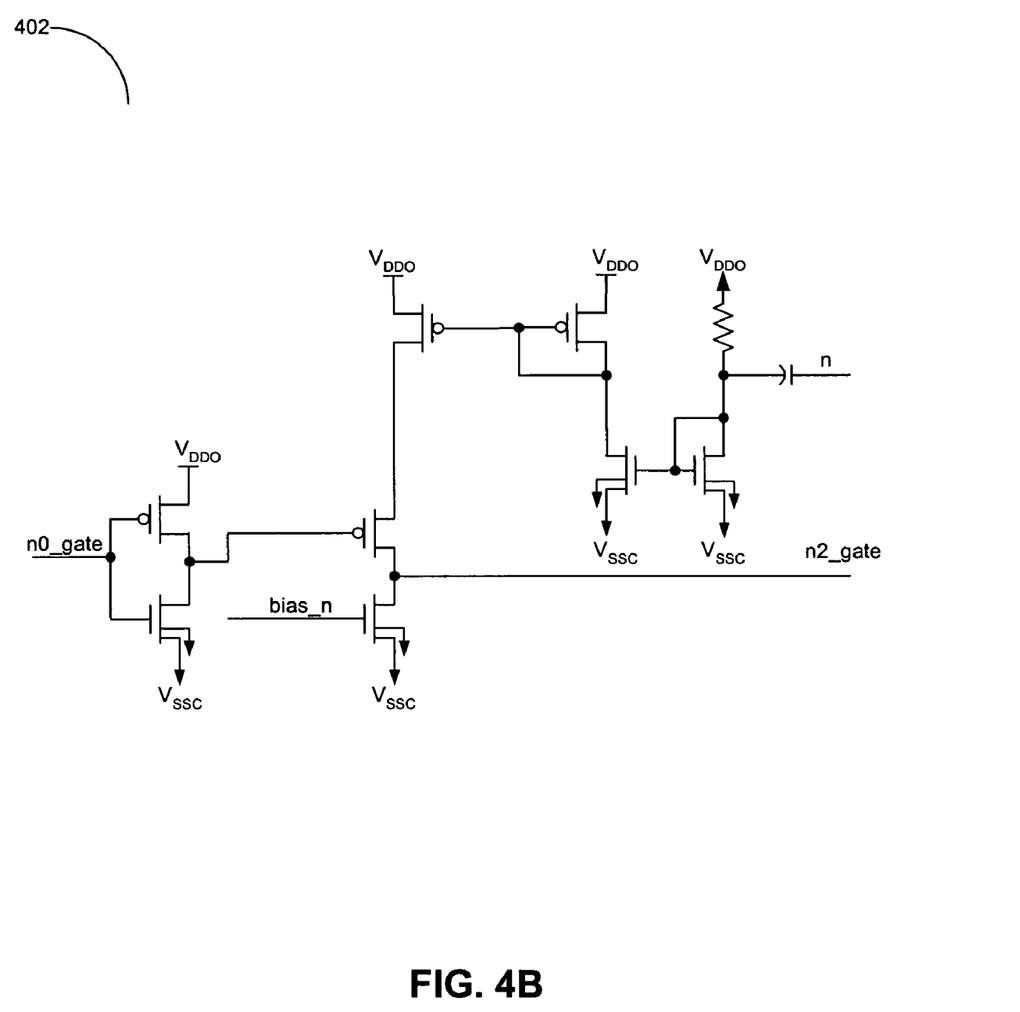
FIG. 4b is a variation of the circuit shown in FIG. 3b.

Still other exemplary transistor level circuits 400 and 402 of the compensator circuits of the present invention are shown in FIGS. 4A and 4B. The embodiment shown in FIGS. 4A and 4B is a variation of the embodiment of FIGS. 3A and 3B respectively, wherein a current source is used to provide a wider analog control over the voltage of the p2_gate and n2_gate. In FIG. 4A, a bias_p gate is a controlled voltage referenced to the supply voltage $V_{DDO}$. In the simplest case, bias_p is tied to $V_{SSC}$. In FIG. 4B, bias_n is a controlled voltage referenced to $V_{SSC}$. In the simplest case, bias_n is tied to $V_{DDO}$.

The foregoing description of the preferred embodiments provide an illustration and description, but is not intended to be exhaustive or to limit the invention to the precise form disclosed. Modifications and variations are possible consistent with the above teachings, or may be acquired from practice of the invention.

What is claimed is:

1. A circuit comprising:
   first and second active devices, a junction formed of first nodes of the first and second devices forming a first input port and a junction formed of respective second and third nodes of the first and second devices forming a first output port;
   third, fourth, and fifth active devices, a gate of the third device being coupled to the first output port, a source of the third device being connected to a drain of the fourth device, and a drain of the third device being connected to a source of the fifth device, the drain of the third device and the source of the fifth device forming an output port;
   wherein a gate of the fifth device forms a second input port;
   sixth, seventh, and eighth active devices, a gate of the sixth device being connected to a gate of the fourth device, a drain of the sixth device being connected to a source of the seventh device, the gate and drain of the sixth device being connected together;
   wherein a gate of the seventh device is connected to a gate of the eight device, the gate and a source of the eighth device being connected together; and
   a charge storing device having a first end forming a third input port and a second end connected to the source of the eighth device.

2. The circuit of claim 1, further comprising an impedance device having a first end coupled to the second end of the charge storing device.

3. The circuit of claim 2, wherein the active devices include transistors.

4. The circuit of claim 3, wherein the first nodes are gates, the second nodes are sources, and the third nodes are drains.

5. The circuit of claim 4, wherein the charge storing device is a capacitor.

* * * * *